US012027229B2

(12) United States Patent
Balasubramanian et al.

(10) Patent No.: US 12,027,229 B2
(45) Date of Patent: Jul. 2, 2024

(54) HIGH SPEED DIFFERENTIAL ROM

(71) Applicant: Texas Instruments Incorporated, Dallas, TX (US)

(72) Inventors: Suresh Balasubramanian, Dallas, TX (US); David J. Toops, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 145 days.

(21) Appl. No.: 17/877,954

(22) Filed: Jul. 31, 2022

(65) Prior Publication Data

US 2023/0267969 A1 Aug. 24, 2023

Related U.S. Application Data

(60) Provisional application No. 63/311,677, filed on Feb. 18, 2022.

(51) Int. Cl.
*G11C 7/06* (2006.01)
*G11C 7/10* (2006.01)
*G11C 7/12* (2006.01)
*H03K 19/173* (2006.01)

(52) U.S. Cl.
CPC ............ *G11C 7/062* (2013.01); *G11C 7/1069* (2013.01); *G11C 7/12* (2013.01); *H03K 19/1737* (2013.01)

(58) Field of Classification Search
CPC .......... G11C 7/062; G11C 7/1069; G11C 7/12
See application file for complete search history.

(56) References Cited

U.S. PATENT DOCUMENTS

| | | | |
|---|---|---|---|
| 6,462,998 B1 | 10/2002 | Proebsting | |
| 6,504,778 B1 | 1/2003 | Uekubo | |
| 7,012,846 B2 | 3/2006 | Balasubramanian et al. | |
| 7,016,245 B2 | 3/2006 | Balasubramanian et al. | |
| 10,056,151 B1 | 8/2018 | Vining | |
| 2002/0021605 A1* | 2/2002 | Harada | G11C 29/24 365/201 |
| 2008/0025089 A1* | 1/2008 | Scheuerlein | G11C 17/18 365/185.03 |
| 2008/0031054 A1 | 2/2008 | Lehmann et al. | |
| 2010/0124089 A1 | 5/2010 | Ali et al. | |
| 2014/0140121 A1 | 5/2014 | Clinton | |
| 2014/0185401 A1 | 7/2014 | Yang et al. | |

OTHER PUBLICATIONS

PCT Search Report, Application No. PCT/US2023/013200, dated May 9, 2023. 3 pages.

* cited by examiner

*Primary Examiner* — Han Yang
(74) *Attorney, Agent, or Firm* — Andrew R. Ralston; Frank D. Cimino

(57) ABSTRACT

A semiconductor device includes a ROM, a differential sense amplifier and a multiplexer logic circuit. The ROM has memory cells in rows along word lines and columns along bit lines, and a reference column having reference transistors along a reference bit line. The multiplexer logic circuit couples a selected bit line to a first differential amplifier input and couples the reference bit line to the second differential amplifier input and controls a reference current of the reference bit line to be between a first bit line current of a programmed memory cell and a second bit line current of an unprogrammed memory cell.

18 Claims, 16 Drawing Sheets

HIGH SPEED DIFFERENTIAL ROM

CROSS-REFERENCE TO RELATED APPLICATION

This application claims priority to and benefit of U.S. Provisional Patent Application No. 63/311,677, filed on Feb. 18, 2022, and titled "High Speed Differential ROM", the contents of which are hereby fully incorporated by reference.

BACKGROUND

The disclosed subject matter relates to read-only memory (ROM). ROM is used in many systems for storing firmware, software, or other computer executable instructions, as well as for data storage in a processor-based electronic system or device. Example ROM memories include a field effect transistor (FET) device programmed to one of two distinguishable electrical states and having a gate connected to an associated word line, a grounded source, and a drain connected to a bit line for a programmed cell and disconnected from the bit line for an unprogrammed cell. Reduced ROM read access times can improve system performance, but faster read access is a tradeoff versus ROM bit cell area with smaller ROM bit cells having better density and slower performance due to increased local mismatch, whereas larger ROM bit cells exhibit faster performance at the expense or increased circuit area and also increased bit line loading with increased leakage. Improved read time performance with little or no tradeoff in circuit area and leakage would benefit system performance.

SUMMARY

In one aspect, a semiconductor device includes a ROM, a differential sense amplifier, and a multiplexer logic circuit. The ROM has a plurality of memory cells in an array arranged in respective rows along word lines and columns along bit lines, with a column of the array having reference cells along a reference bit line. The memory cells include one of a corresponding plurality of cell transistors configured in a first state to conduct a first bit line current along the respective bit line when selected or in a second state to conduct a second bit line current that is less than the first bit line current. The differential sense amplifier is configured to generate a differential output voltage signal between first and second differential outputs based on first and second differential input currents at respective first and second amplifier inputs. The multiplexer logic circuit is configured to selectively couple a selected bit line to the first amplifier input, couple a reference current to the second amplifier input via the reference bit line, and control the reference current to be between the first bit line current and the second bit line current.

In another aspect, a method of forming a semiconductor device includes forming transistors in or over a semiconductor layer and forming a metallization structure with transistor interconnections to form a read-only memory (ROM), a differential sense amplifier, and a multiplexer logic circuit configured to selectively couple a selected bit line to a first amplifier input, couple a reference current to a second amplifier input via a reference bit line, and control the reference current to be between a first bit line current of a programmed cell and a second bit line current of an unprogrammed cell.

BRIEF DESCRIPTION OF THE DRAWINGS

FIGS. 1A-1 and 1A-2 show a schematic diagram illustrating details of an example implementation of the ROM, the differential sense amplifier, and the multiplexer logic circuit.

FIG. 2 is a flow diagram of a method of fabricating an electronic device.

DETAILED DESCRIPTION

Figure 1:
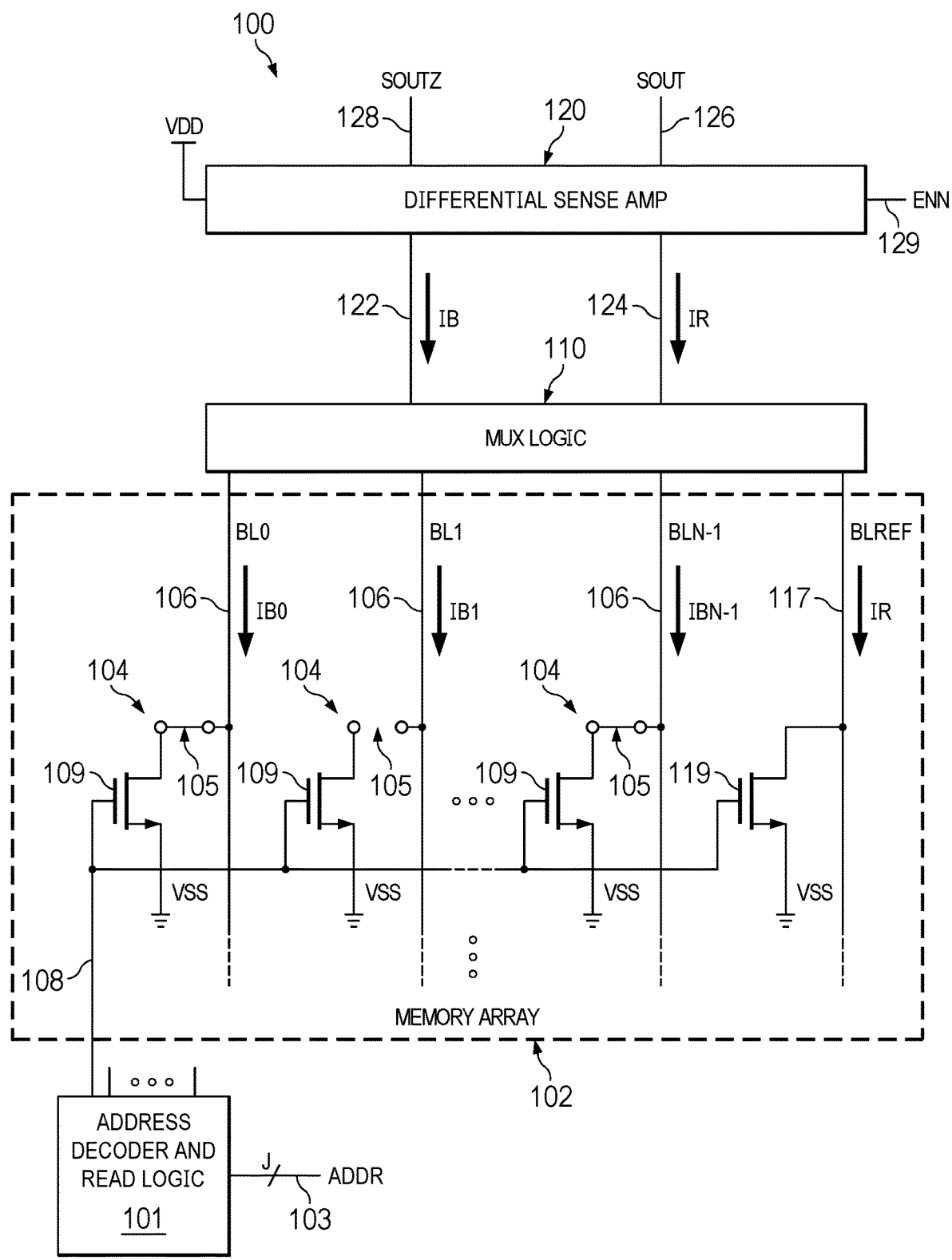
FIG. 1 is a simplified schematic diagram of an electronic device with a ROM, a differential sense amplifier, and a multiplexer logic circuit.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value.

Figures 1, 1A:
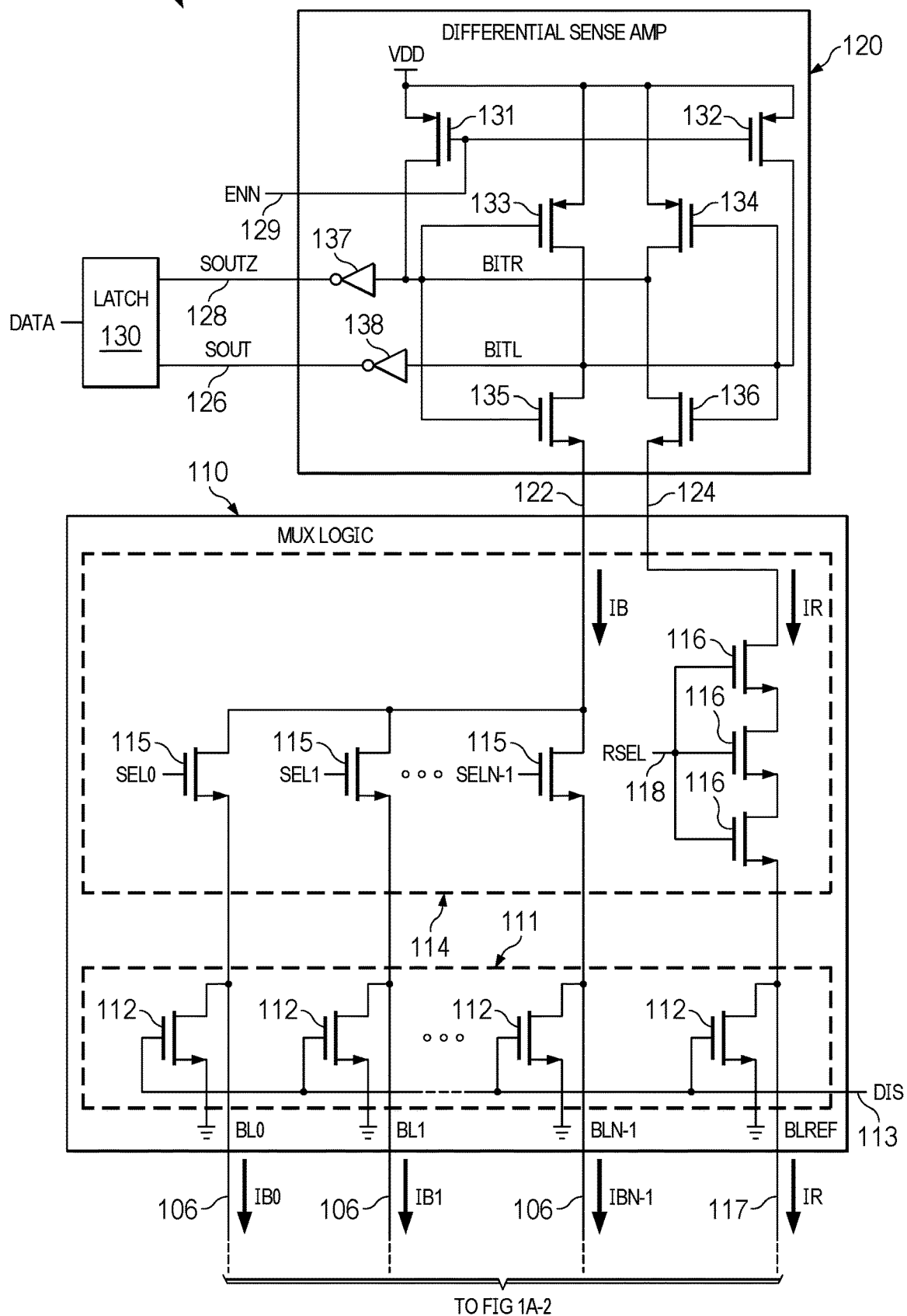
Figures 1, 1A, 2:
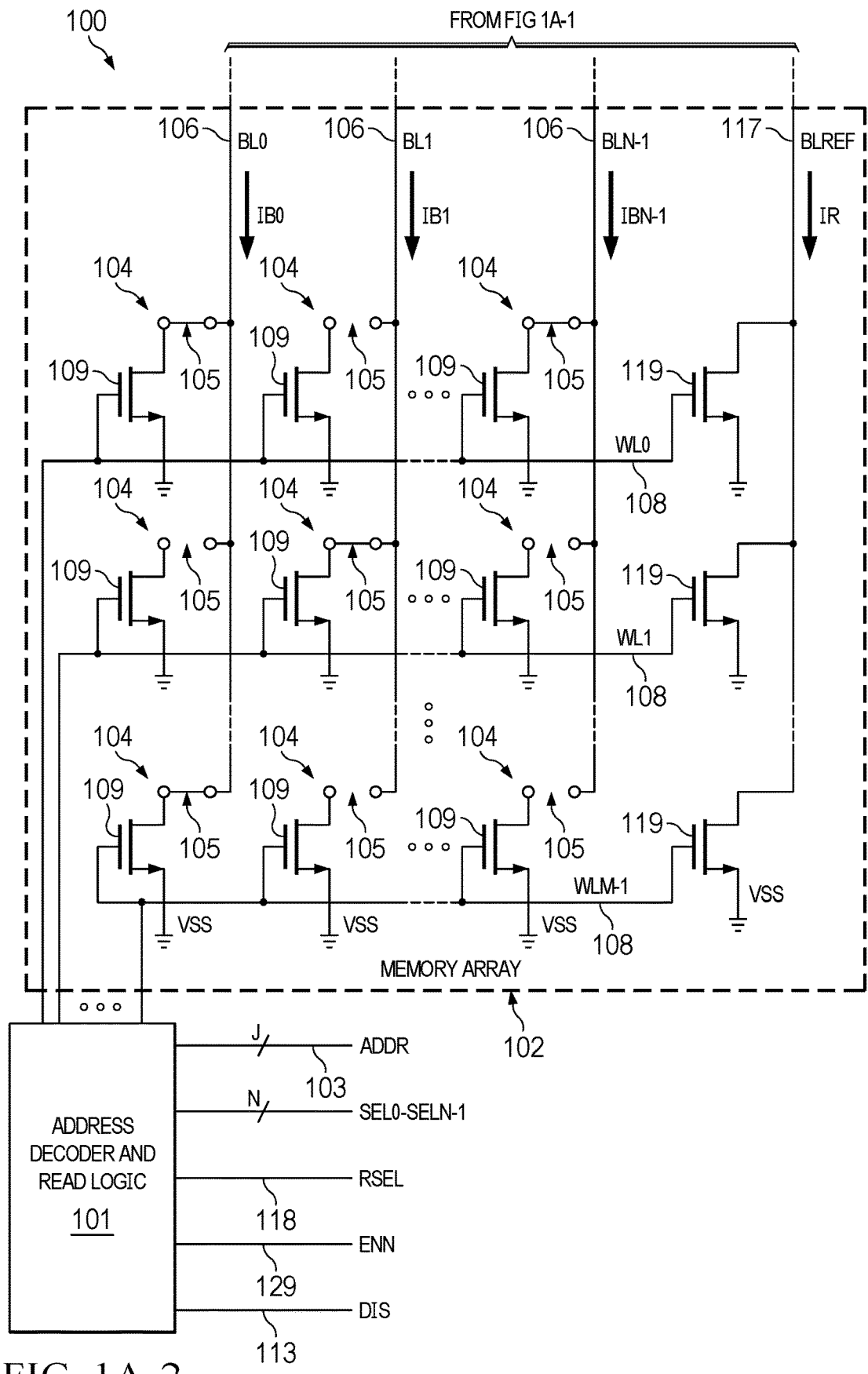

Referring initially to FIGS. 1-1D, FIGS. 1, 1A-1, and 1A-2 show an electronic device 100, e.g. a memory system, with an address decoder and read logic circuit 101 and a ROM 102 (e.g., labeled "MEMORY ARRAY") having an array of memory cells 104 with respective programming features 105. The memory cells 104 are arranged in columns along respective bit lines 106 and rows along respective word lines 108. In the example of FIGS. 1, 1A-1, and 1A-2, the ROM 102 has an integer number N columns of memory cells 104 and corresponding bit lines 106 with respective bit line voltage signals BL0, BL0, . . . , BLN-1, and an integer number M rows and corresponding word lines 108 with respective word line voltage signals WL0, WL1, . . . , WLM-1, where N and M can be any positive integers and may and need not be equal. Each of the memory cells 104 includes a corresponding instance of a cell transistor 109. In the illustrated example, the cell transistors 109 are n-channel field effect transistors (FETs) having a source coupled to a reference voltage node VSS, a gate coupled to the respective word line 108 and a drain coupled to the respective programming feature 105. Different types of cell transistors 109 may be used in other implementations, including without limitation, p-channel FETs, bipolar transistors, or cell diodes. In one example, the programming features 105 can be fuses or antifuses. The programming features 105 are coupled between the drain of the respective cell transistor 109 and the respective bit line 106. As used herein, the individual cell transistors 109 are configured in a first state or a second state by the configuration of the respective programming feature 105.

As used herein, a respective cell transistor 109 is configured in the first state (e.g., representing binary data value of 0) and is referred to as a programmed memory cell 104 by the respective programming feature being configured to electrically connect the cell transistor drain to the respective bit line 106, and the cell transistor 109 is configured in the second state (e.g., representing binary data value of 1) and is referred to as an unprogrammed memory cell 104 by the respective programming feature being configured such that the cell transistor drain is not connected to the respective bit line 106. The cells 104 in the first state (e.g., data 0, programmed) conduct a first bit line current I1 along the respective bit line 106 when selected, and the cells 104 in the second state (e.g., data 1, unprogrammed) conduct a second bit line current I2 along the respective bit line 106 when selected. (See FIGS. 1B and 1C infra and associated description.) For programmed cells 104, the cell transistor 109 is connected to the respective bit line 106 and when selected by a gate signal on the respective word line 108, the cell transistor 109 conducts the first current I1 from the bit line 106 to the reference voltage node VSS. In contrast, selection of an unprogrammed memory cell 104 does not provide any additional current flow path to the VSS node, and the first bit line current I1 of a programmed cell 104 is greater than the second bit line current I2 of an unprogrammed memory cell 104. In the illustrated example, the first current I1 and the second current I2 are both negative, and the first current I1 is more negative (has a greater negative amplitude) than the second current I2. In this and other examples, the absolute value of the first current I1 is greater than the absolute value of the second current I2.

The electronic device 100 includes a multiplexer logic circuit 110 (e.g., labeled "MUX LOGIC") having a discharge circuit 111 with discharge transistors 112 coupled to the respective bit lines 106. In the illustrated example, the discharge transistors 112 are n-channel FETs having a source coupled to the reference voltage VSS, a gate coupled to a discharge control input 113, and a drain coupled to the respective bit line 106. Different types of discharge transistors 112 may be used in other implementations, including without limitation, p-channel FETs, bipolar transistors, etc.

The multiplexer logic circuit 110 also includes a select circuit 114 having a row of bit select transistors 115 with source terminals coupled to the respective bit lines 106. The address decoder and read logic circuit 101 has outputs that generate voltage signals to operate the memory cells 104 and the multiplexer logic circuit 110 for memory read operations when the electronic device 100 is powered and operating. In a memory read operation, the address decoder and read logic circuit 101 provides the word line voltage signals WL0, WL1, . . . , WLM-1 to the gates of the cell transistors 109 to selectively activate a selected row of memory cells 104 along a selected word line 108. In the illustrated example using n-channel FET cell transistors 109, the address decoder and read logic circuit 101 provides the word line voltage signal for the selected word line 108 at a first voltage to turn on the cell transistors 109 of the selected row and provides the word line voltage signals for the non-selected word lines 108 at a second voltage that is lower than the first voltage to turn off the cell transistors 109 of the non-selected rows.

The address decoder and read logic circuit 101 also selectively provides a discharge voltage signal DIS to the discharge control input 113 to discharge the bit lines 106 at the beginning of a read operation. In the illustrated example with n-channel FET discharge transistors 112, the address decoder and read logic circuit 101 provides the discharge voltage signal DIS at a first voltage to turn on the discharge transistors 112 and bring the respective bit lines 106 to or near the potential of the reference voltage node VSS, and then provides the discharge voltage signal DIS at a second voltage that is lower than the first voltage to subsequently turn off the discharge transistors 112. The bit select transistors 115 are coupled between a first amplifier input 122 and the respective bit lines 106.

A column of the array of the ROM 102 provides a reference for differential sensing, referred to as a reference column. The final array column in one example provides the reference column of the array in the illustrated example. In other implementations, another column of the array forms the reference column. The select circuit 114 includes three reference select transistors 116 in the reference column, and the ROM 102 includes a reference bit line (RBL) 117 of the reference column, which has a reference bit line voltage signal BLREF. The reference select transistors 116 have gate terminals connected to a reference select input 118, and the reference column of the array has reference transistors 119 along the reference bit line 117. The discharge circuit 111 includes a reference discharge transistor 112. The reference discharge transistor 112 in the illustrated example is an n-channel FET having a drain coupled to the reference bit line 117, a gate coupled to the discharge control input 113, and a source coupled to the reference voltage VSS. Different types of discharge transistors 112 may be used in other implementations, including without limitation, p-channel FETs, bipolar transistors, etc. In the illustrated example, the reference discharge transistor 112 and the discharge transistors 112 along the N memory bit lines 106 are of similar size to one another, e.g. have about a same first gate width. In this or another example, the cell transistors 109 of the memory cells 104 and the reference transistors 119 along a reference bit line 117 are of similar size to one another, e.g. have about a same second gate width. In these or another example, the bit select transistors 115 and the reference select transistors 116 are of similar size to one another, e.g., have about a same third gate width. The first, second and third gate widths may be about the same, or may be different from each other in various examples.

The address decoder and read logic circuit 101 includes outputs coupled to the respective gates of the bit select transistors 115 and an output coupled to the reference select input 118. The address decoder and read logic circuit 101 in the illustrated example provides select voltage signals SEL0, SEL1, . . . , SELN-1 to select one of the columns along a selected bit line 106 during a memory read operation, and concurrently provides a reference select voltage signal RSEL to select the reference column during a memory read operation using differential sensing. In the illustrated example using n-channel FET select transistors and n-channel FET reference select transistors 116, the address decoder and read logic circuit 101 provides the select voltage signal SEL for the selected bit line 106 and the reference select voltage signal RSEL at a first voltage to turn on the bit select transistor 115 of the selected column and to turn on the reference select transistors 116, and the address decoder and read logic circuit 101 provides the select voltage signals SEL of the non-selected columns at a second voltage that is lower than the first voltage to turn off the bit select transistors 115 of the non-selected columns.

The electronic device 100 includes a differential sense amplifier 120. The differential sense amplifier 120 has the first amplifier input 122 and a second amplifier input 124 to sense a differential current signal from the multiplexer logic circuit 110 during memory read operations. The differential sense amplifier 120 has a first amplifier output 126 (S OUT), a second amplifier output 128 (SOUTZ), and an enable input 129 that receives an enable voltage signal ENN from the address decoder and read logic circuit 101. In operation, the differential sense amplifier 120 generates a differential output voltage signal S OUT, SOUTZ between the first and second amplifier outputs 126, 128 based on a differential input current signal based on currents of the first and second amplifier inputs 122 and 124. In operation during a memory read operation, the multiplexer logic circuit 110 selectively couples a selected one of the bit lines 106 to the first amplifier input 122 and couples the reference bit line 117 to the second amplifier input 124.

The example differential sense amplifier 120 in FIG. 1A-1 is connected to a supply voltage VDD, and provides the differential output voltage signal SOUT, SOUTZ to a latch 130 during memory read operations. The latch 130 includes a data output that provides an output signal DATA that represents the data or state of the selected memory cell 104 (e.g., data 0, programmed or data 1, unprogrammed). In one example, the address decoder and read logic circuit 101 chooses a selected word of the ROM 102 and sequentially selects individual cell bit lines 106 of the selected word line 108 and uses a single differential sense amplifier 120 to sequentially read the individual cell data bits. In another implementation, multiple differential sense amplifiers 120 can be used for concurrent reading of multiple bits of a selected word line 108. The differential sense amplifier 120 includes pull up transistors 131 and 132. In the illustrated example, the transistors 131 and 132 are p-channel FETs with sources coupled to the supply voltage VDD and gates coupled to the enable input 129. The differential sense amplifier 120 also includes left-side and right-side inverter circuits, with upper p-channel FETs 133 and 134 and lower n-channel FETs 135 and 136, respectively. The transistors 133 and 135 form a first inverter circuit in a left circuit branch of the differential sense amplifier 120, and the transistors 134 and 136 form a second inverter circuit in a right circuit branch. The differential sense amplifier 120 also includes output buffer inverters 137 and 138 having inputs coupled to the gates of the respective first and second inverter circuits. The output buffer inverter 137 has an output coupled to the second amplifier output 128 to provide the output voltage signal SOUTZ based on a right-side bit voltage signal BITR, and an output of the output buffer inverter 138 is coupled to the first amplifier output 126 to provide the output voltage signal SOUT based on a left-side bit voltage signal BITL. In a memory read operation, following discharging of the bit lines 106 by the discharge circuit 111, the address decoder and read logic circuit 101 asserts a selected word line 108 and asserts a selected one of the select voltage signals as well as the reference select signal RSEL to turn on the bit select transistor 115 of the selected column and to turn on the reference select transistors 116 to couple the selected bit line 106 to the first amplifier input 122 and to couple the reference bit line 117 to the second amplifier input 124.

The multiplexer logic circuit 110 also controls a reference current IR of the reference bit line 117 to be between the first bit line current I1 and the second bit line current I2 during a memory read operation. In one example, the multiplexer logic circuit 110 controls the reference current IR of the reference bit line 117 to be approximately half the first bit line current I1 (e.g., 45% to 55% of the first bit line current I1). As shown in the example of FIG. 1A-1, the select circuit 114 has three reference select transistors 116 coupled in series between the second amplifier input 124 and the reference bit line 117, and the reference select transistors 116 are of similar size to the bit select transistors 115, e.g., have about a same gate width. In this example, the three series connected reference select transistors 116 control the reference current IR of the reference bit line 117 to be approximately half the first bit line current I1. This facilitates differentiation during memory read operations of current IB1 conducted by a selected cell transistor 109 of a cell 104 that has been programmed by connection to the respective bit line 106 by the programming feature 105, from the current of a selected unprogrammed cell transistor 109 that is disconnected from the respective bit line 106. In one implementation, the reference bit line 117 can be coupled to the second amplifier input 124 of multiple differential sense amplifiers 120 that are concurrently used to read respective bets from a selected word line 108, with the multiplexer logic circuit 110 including corresponding bit select transistors 115 routed to the respective first amplifier inputs 122 of the respective differential sense amplifiers 120. This approach can reduce the circuit area significantly compared to differential sensing in which each selected cell has a corresponding bit line and complement bit line for sensing.

The control of the reference current IB by the multiplexer logic circuit 110 to be between the first and second currents I1 and I2, and in particular approximately half the first current I1, facilitates accurate cell state reading largely independent of the ratio between the first and second currents I1 and I2. The cell state reading is also largely independent of the cell leakage current levels in the array because of the substantial similarity in sizing of the memory cell transistors 109 and the reference transistors 119. and the leakage current becomes common for both the bit lines 106 and the reference bit line 117. Another advantage of the electronic device 100 is improved memory read times, wherein differential sensing is much faster than single ended voltage or current sensing which require full voltage swings during read operations. In addition, the described examples do not need blocking architecture or segmentation of the array into multiple blocks in order to achieve faster performance. This further advantage also facilitates reduction in circuit routing complexity, thereby potentially saving one level of a multilevel interconnect routing (e.g., metallization) structure in the fabrication of the electronic device 100. Moreover, the reference bit line 117 used for differential sensing has the same or similar electrical characteristics as the respective bit lines 106 due to matching and fabrication of the respective transistors 115 and 119 of substantially similar sizes, which reduces local mismatch variation effects. In addition, the reference bit line 117 in certain implementations is common for multiple cell bit lines 106, resulting in avoidance or mitigation of mismatch effects compared with creating the reference outside the array where the local mismatch variation may be much larger.

Figure 1B:
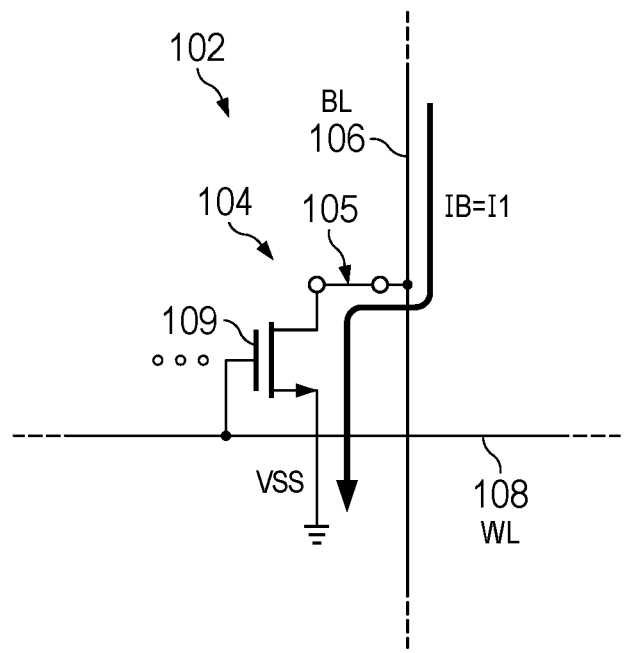
FIG. 1B is a schematic diagram of a programmed cell in the ROM.
Figure 1C:
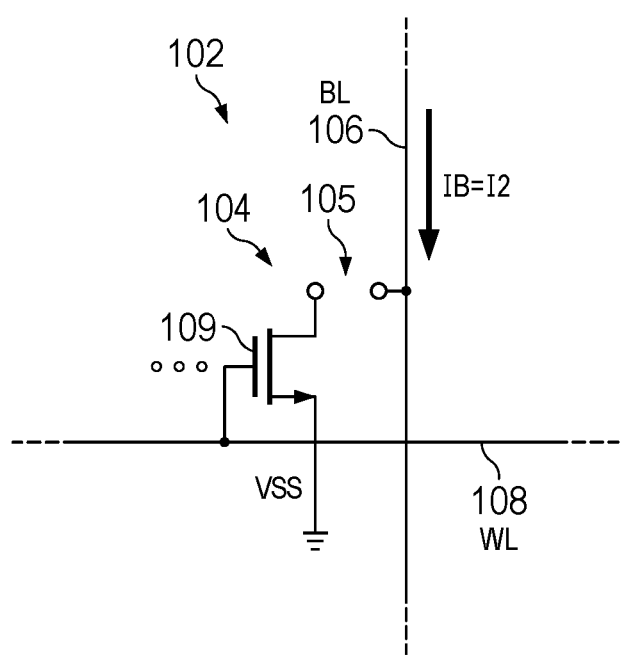
FIG. 1C is a schematic diagram of an unprogrammed cell in the ROM.

Referring also to FIGS. 1B and 1C, FIG. 1B shows a programmed memory cell 104 in the ROM 102, and FIG. 1C shows an unprogrammed memory cell 104 in the ROM 102. For the program memory cell 104 in FIG. 1B, the cell transistor 109 is electrically coupled to the bit line 106 by the programming feature 105. When the selected word line 108 is asserted (e.g., at a first voltage), the selected cell transistor 109 is turned on and conducts bit line current IB at the first current I1 from the bit line 106 to the reference voltage node VSS. For the unprogrammed memory cell 104 in FIG. 1C, the cell transistor 109 is electrically disconnected from the bit line 106 (e.g., the programming feature 105 is an open circuit). In this case, when the selected word line 108 is asserted (e.g., at the first voltage), the selected cell transistor 109 is turned on but does not conduct any current from the bit line 106, and the bit line current IB represents leakage current at the second current I2, which is significantly lower than the first current I1 for a programmed cell 104.

Figure 1D:
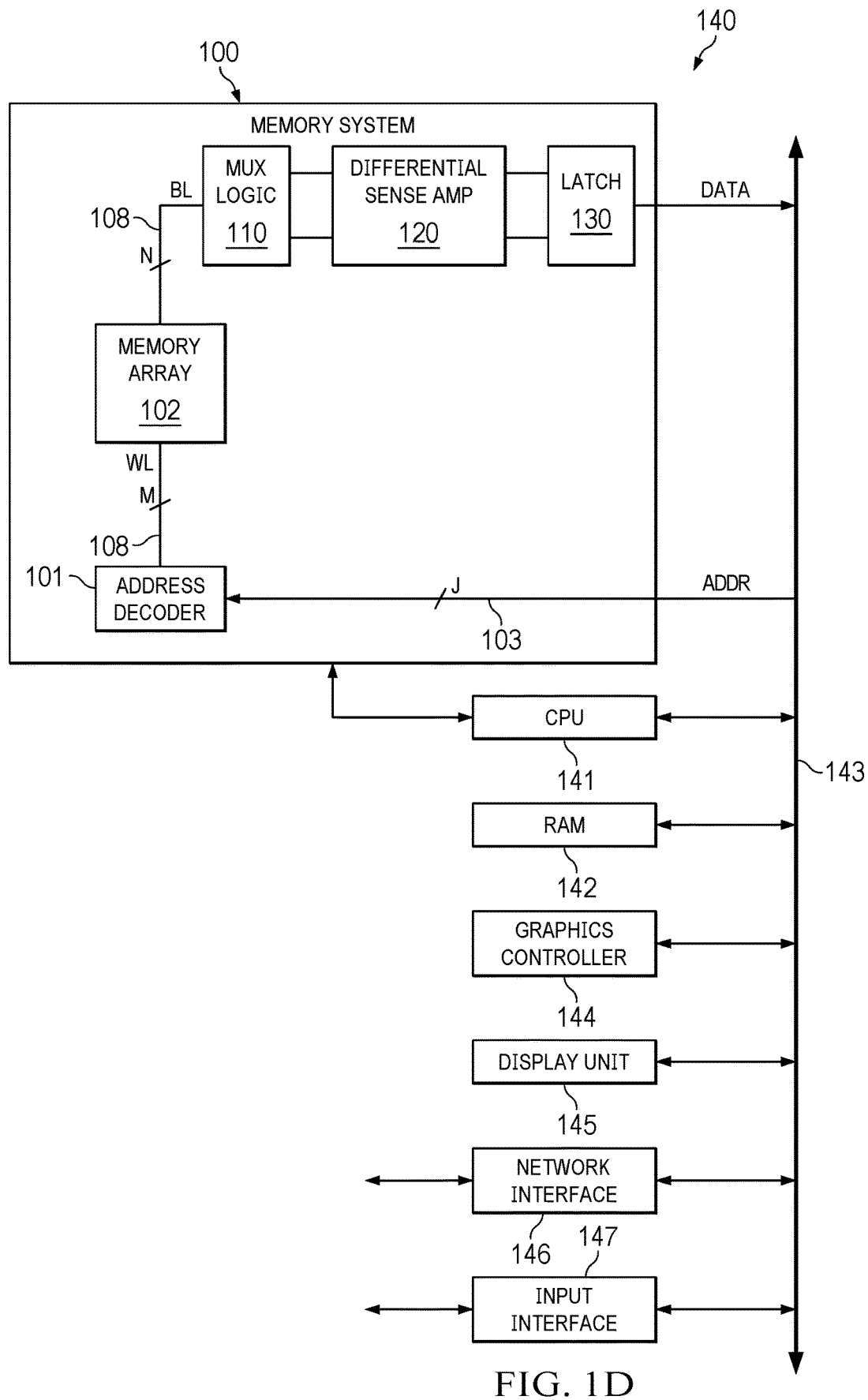
FIG. 1D is a simplified schematic diagram of an example digital processing system.
Figure 2:
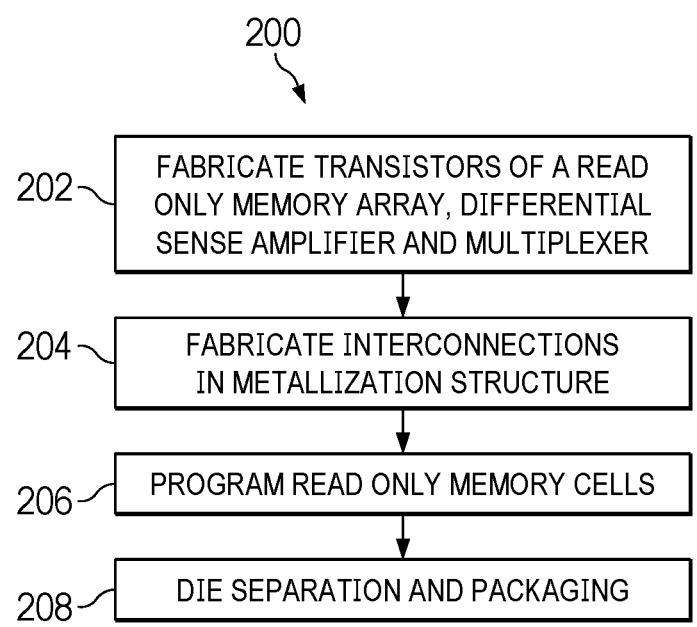

FIG. 1D shows an example digital processing system 140 in which several aspects of the ROM apparatus and differential sensing may be implemented. The system 140 represents an example digital processing system in which the electronic device 100 may be implemented according to another aspect. The system 140 may contain one or more processors such as a central processing unit (CPU) 141, a random-access memory (RAM) 142, the electronic device 100, a graphics controller 144, a display unit 145, a network interface 146, and an input interface 147. In one example, the electronic device 100 implements a compiler ROM. The example of FIG. 1D includes the electronic device 100 as described above, having an implementation of the address decoder and read logic circuit 101 that generates word line voltage signals on the word lines 108, the ROM 102 with bit lines 106, the multiplexer logic circuit 110, the differential sense amplifier 120 and the latch 130 as described above. In one implementation, the components except the display unit 145 may communicate with each other a communication path 143, which may contain several buses, such as the address bus 103 and a data bus. The CPU 141 may execute instructions stored in the compiler ROM electronic device 100, for example, during booting-up of the system 140. The CPU 141 also executes instructions (after boot-up) stored in the RAM 142 to perform a specific task. The CPU 141 may contain multiple processing units, with each processing unit potentially being designed for a specific task. Alternatively, the CPU 141 may contain only a single processing unit. The graphics controller 144 generates and provides display signals (e.g., in RGB format) to the display unit 145 based on data/instructions received from the CPU 141. The display unit 145 contains a display screen to display the images defined by the display signals. The input interface 147 may correspond to a keyboard and/or mouse, and generally enables a user to provide inputs. The network interface 146 enables some of the inputs (and outputs) to be provided on a network. In general, the display unit 145, the input interface 147 and the network interface 146 enable a user to interface with the system 140.

Figure 3:
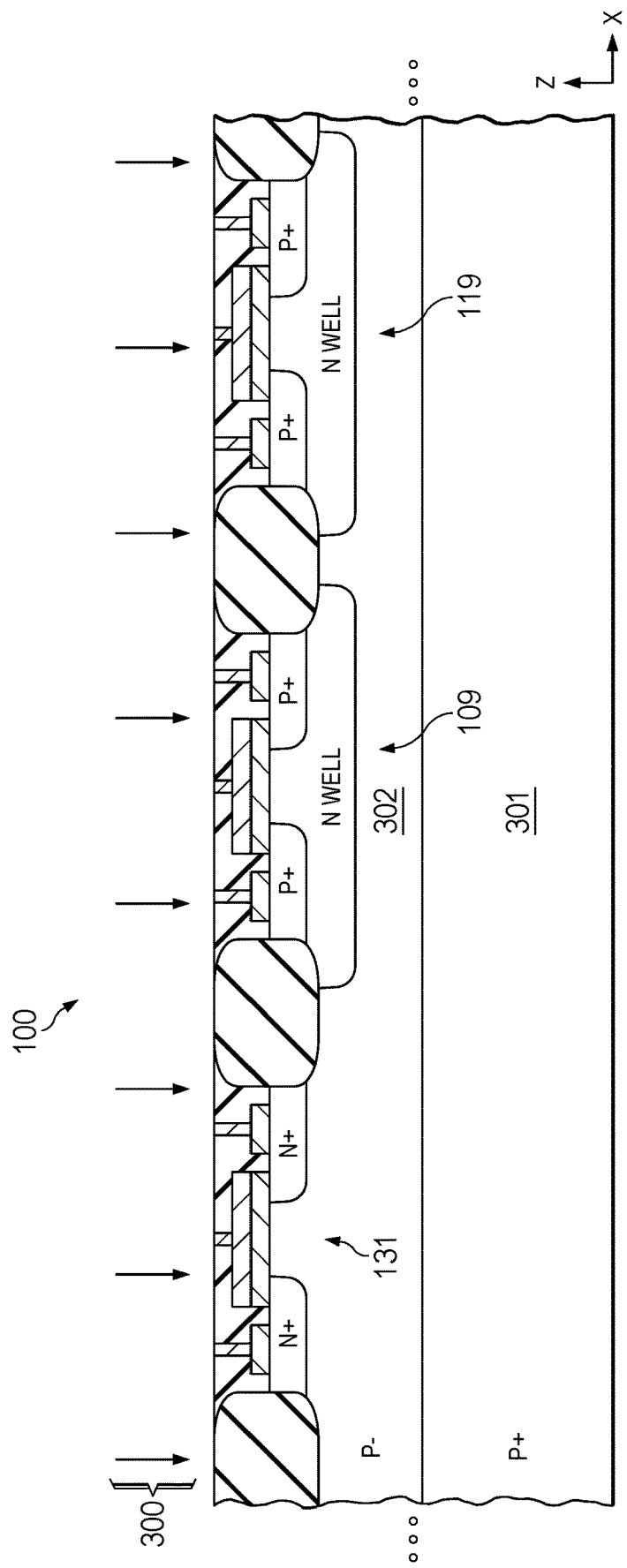
FIGS. 3 and 4 are partial side elevation views of the electronic device of FIG. 1 undergoing fabrication processing according to the method of FIG. 2.
Figure 4:
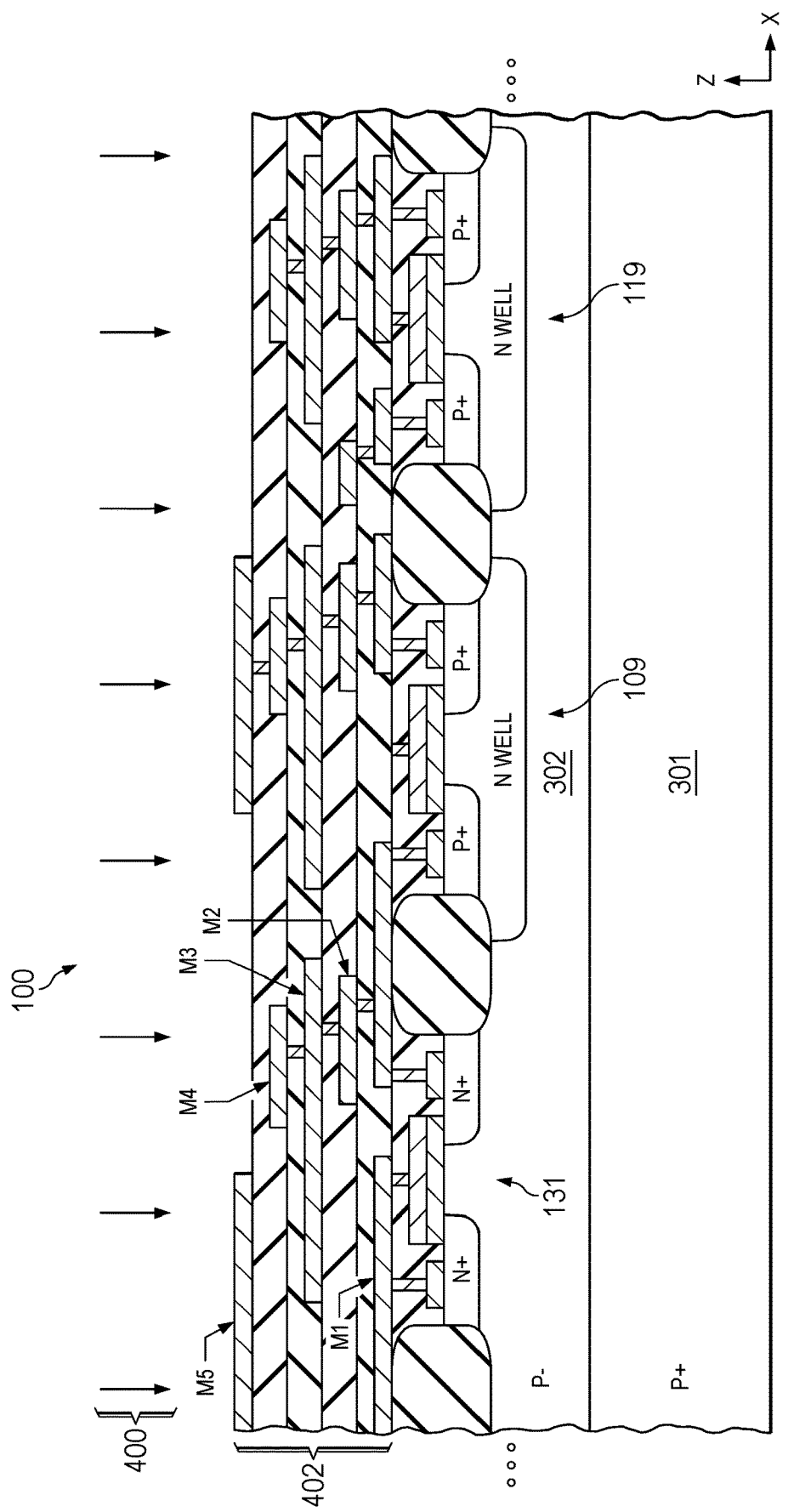
Figure 5:
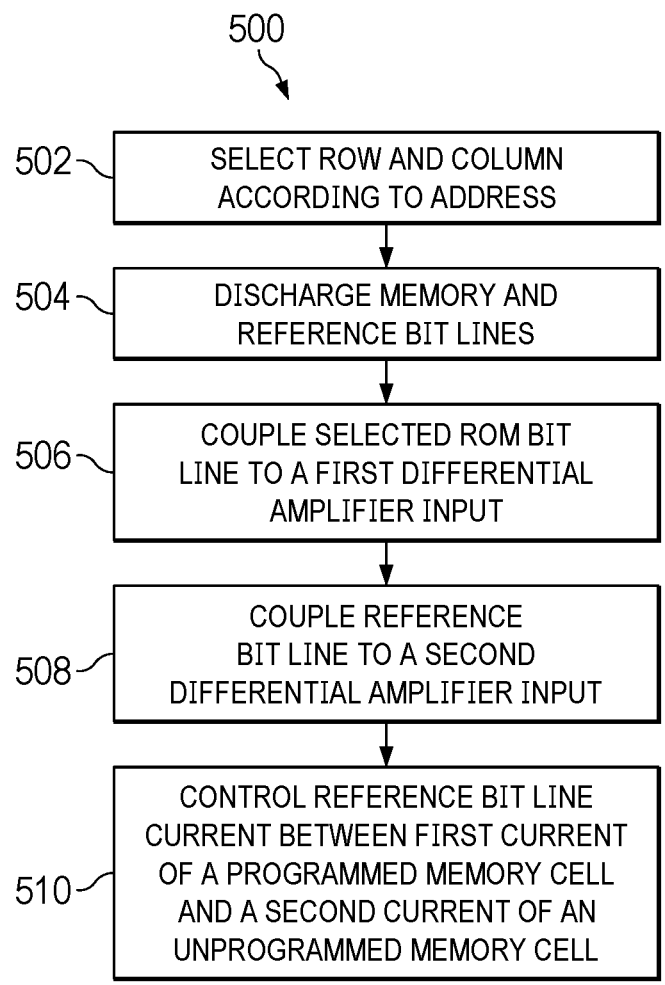
FIG. 5 is a flow diagram of a method of reading a ROM cell.

Referring now to FIGS. 2-4, FIG. 2 shows a method 200 of fabricating an electronic device, and FIGS. 3 and 4 show the electronic device 100 undergoing fabrication processing according to the method 200. The method 200 includes fabricating or otherwise forming transistors, such as the transistors 109, 112, 115, and 131-138 described above, on or in a semiconductor layer at 202. FIG. 3 shows one example, in which semiconductor processing 300 is performed that forms transistors on and/or in a semiconductor surface layer 302 above a semiconductor wafer substrate 301. As shown in the partial view of FIG. 3, the electronic device 100 includes p-channel FETs such as the transistor 131, as well as n-channel FETs 109 and 119, which in this example are of substantially similar sizes to one another (e.g., having about a same gate width).

At 204, interconnections are fabricated as part of forming a metallization structure with transistor interconnections to form a read-only memory, such as the ROM 102, the differential sense amplifier 120, and the multiplexer logic circuit 110. FIG. 4 shows one example, in which a metallization process 400 is performed that fabricates a multilevel metallization structure 402 on the semiconductor surface layer 302, including metal level structures M1, M2, M3, M4, and M5 in an example 5 level structure 402. In other implementations, different numbers of levels can be included in the metallization structure 402. The metallization structure fabrication at 204 in one example includes forming the programming features 105 in FIGS. 1 and 1A above.

The ROM 102 has the array of memory cells 104 arranged in rows along the respective word lines 108 and columns along the respective bit lines 106, the respective memory cells 104 include a cell transistor 109, and the reference column of the array has reference transistors 119 along a reference bit line 117 as illustrated and described above. In addition, the differential sense amplifier 120 has the first amplifier input 122, the second amplifier input 124, the first amplifier output 126, and the second amplifier output 128, and the differential sense amplifier 120 is configured to generate the differential output voltage signal SOUT, SOUTZ across the first and second amplifier outputs 126, 128 based on the differential input current signal of the first and second amplifier inputs 122, 124. The multiplexer logic circuit 110 is configured to selectively couple the selected one of the bit lines 106 to the first amplifier input 122 and to couple the reference bit line 117 to the second amplifier input 124.

In addition, the memory cells 104 programmed in the first state are configured to conduct the first bit line current I1 along the respective bit line 106 when selected, the memory cells 104 programmed in the second state are configured to conduct the lower second bit line current I2 along the respective bit line 106 when selected, and the multiplexer logic circuit 110 is configured to control the reference current IR of the reference bit line 117 to be between the first bit line current I1 and the second bit line current I2.

In one implementation, the method 200 includes programming the read-only memory cells 104 at 206. In another implementation, the programming at 206 is omitted, for example, to be performed by an end user. The method 200 further includes die separation and packaging at 208 to complete the electronic device 100.

In one or more implementations, as discussed above, the multiplexer logic circuit 110 is configured to control the reference current IR of the reference bit line 117 to be approximately half the first bit line current I1. In these or other implementations, the multiplexer logic circuit 110 includes the select circuit 114 with the row of bit select transistors 115 coupled between the first amplifier input 122 and the respective bit lines 106, and three reference select transistors 116 coupled in series between the second amplifier input 124 and the reference bit line 117. In these or further implementations, the bit select transistors 115 and the reference select transistors 116 are of similar size to one another (e.g., have about a same gate width). In various implementations, moreover, the cell transistors 109 and the reference transistors 119 are of similar size to one another as discussed above in connection with FIGS. 1, 1A-1, and 1A-2.

Referring now to FIGS. 5-11, FIG. 5 shows of a method 500 of reading a ROM cell, such as the memory cells 104 illustrated and described above in connection with FIGS. 1, 1A-1, and 1A-2. The method 500 includes selecting a row and column according to an address at 502, for example, using the address decoder and read logic circuit 101 and the multiplexer logic circuit 110 as described above. In one implementation, the method further includes discharging memory array and reference column bit lines at 504, for example, using the discharge circuit 111 in FIG. 1A-1. The method 500 continues at 506 with coupling a selected bit line 106 of the ROM 102 to the first amplifier input 122 of the differential sense amplifier 120, as well as coupling the reference bit line 117 of the ROM 102 to the second amplifier input 124 of the differential sense amplifier 120 at 508. At 510, the method 500 includes controlling the reference current IR of the reference bit line 117 to be between the first bit line current I1 of a programmed ROM memory cell 104 and the second bit line current I2 of an unprogrammed ROM memory cell 104. In one implementation, the method 500 includes controlling the reference current IR of the reference bit line 117 at 510 to be approximately half the first bit line current I1.

Figure 6:
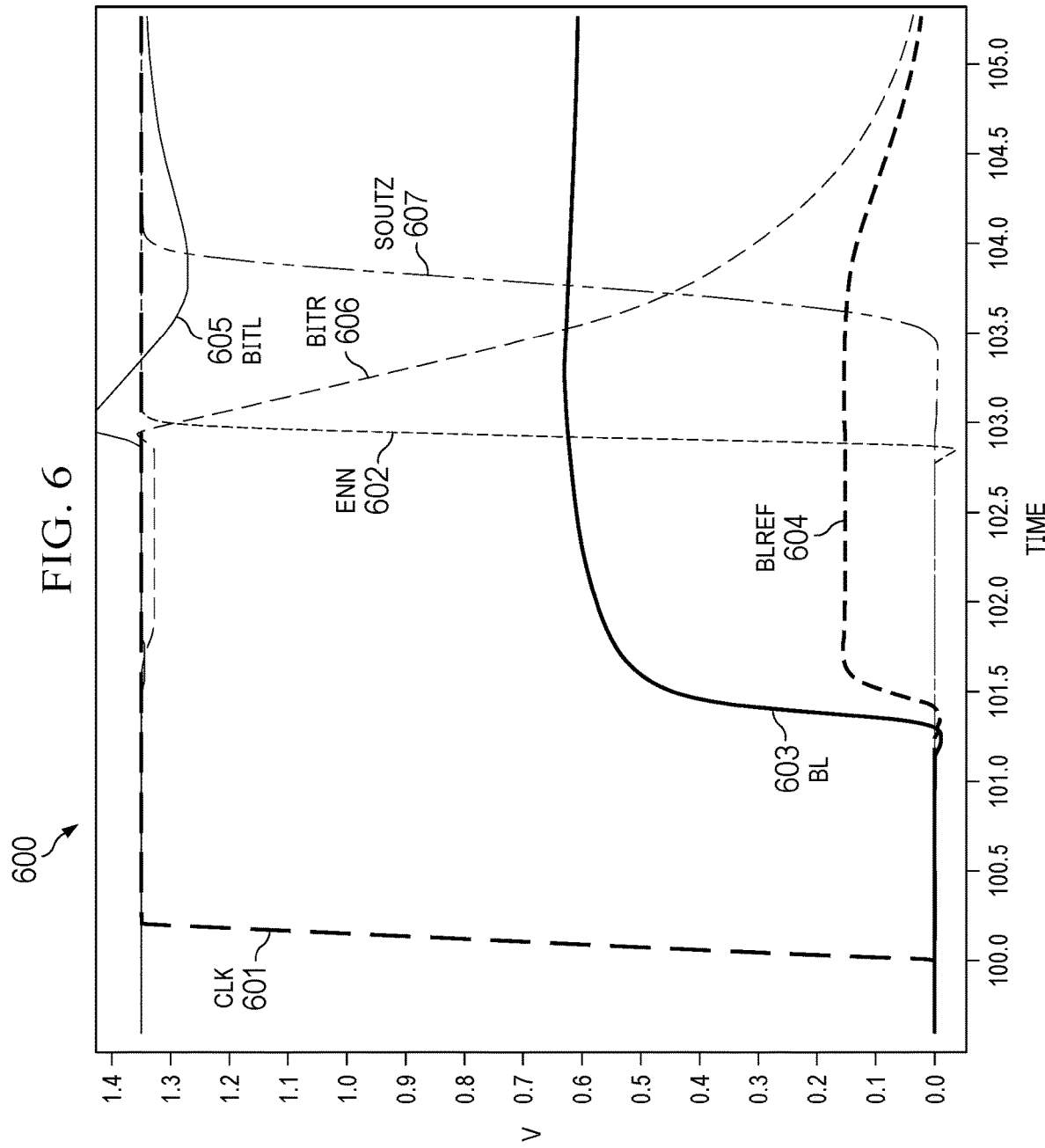
FIG. 6 is a graph of voltage signals in the electronic device during a memory read operation to read an unprogrammed memory cell.
Figure 7:
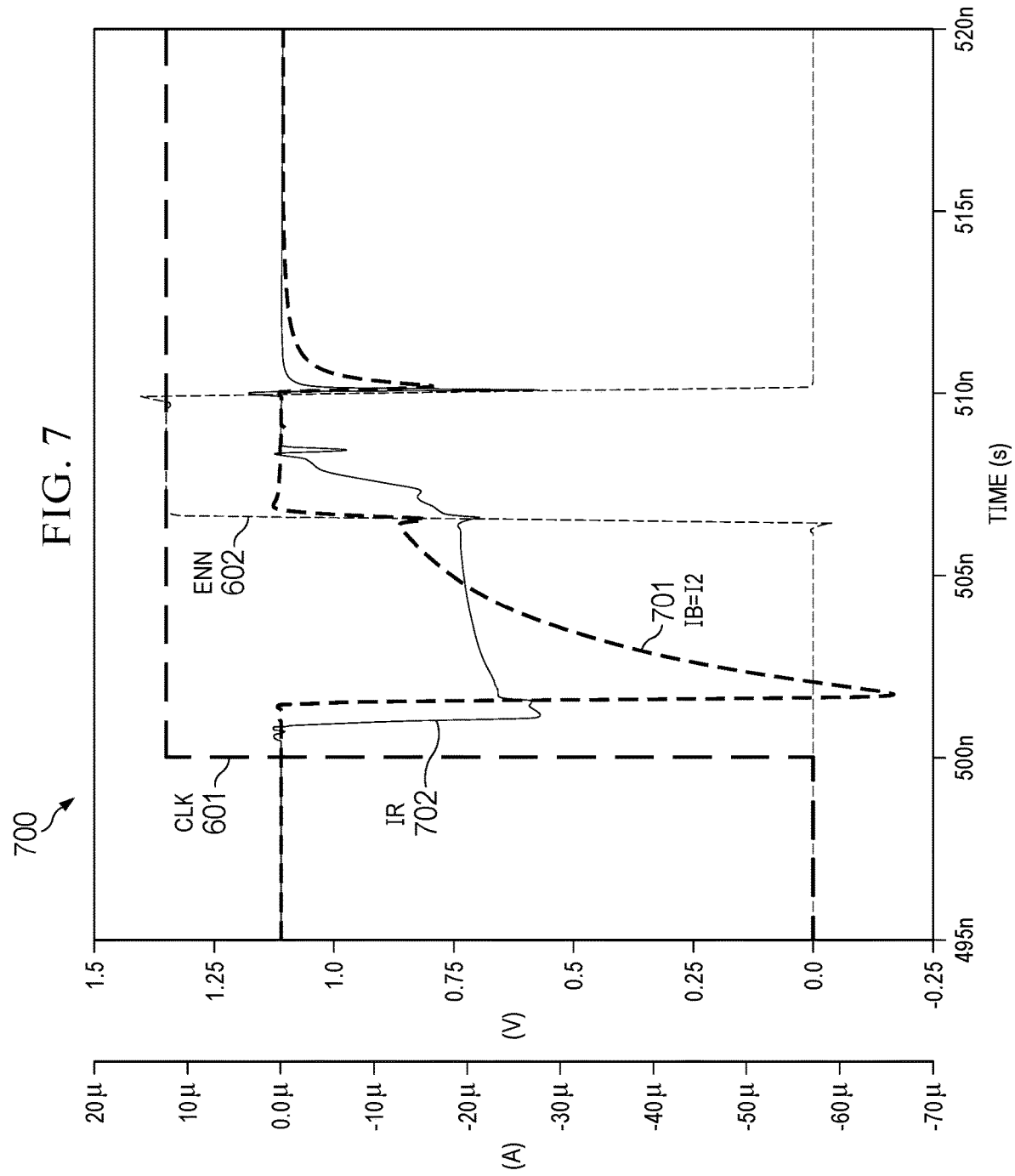
FIG. 7 is a graph of voltage and current signals in the electronic device during a memory read operation to read the unprogrammed memory cell.
Figure 8:
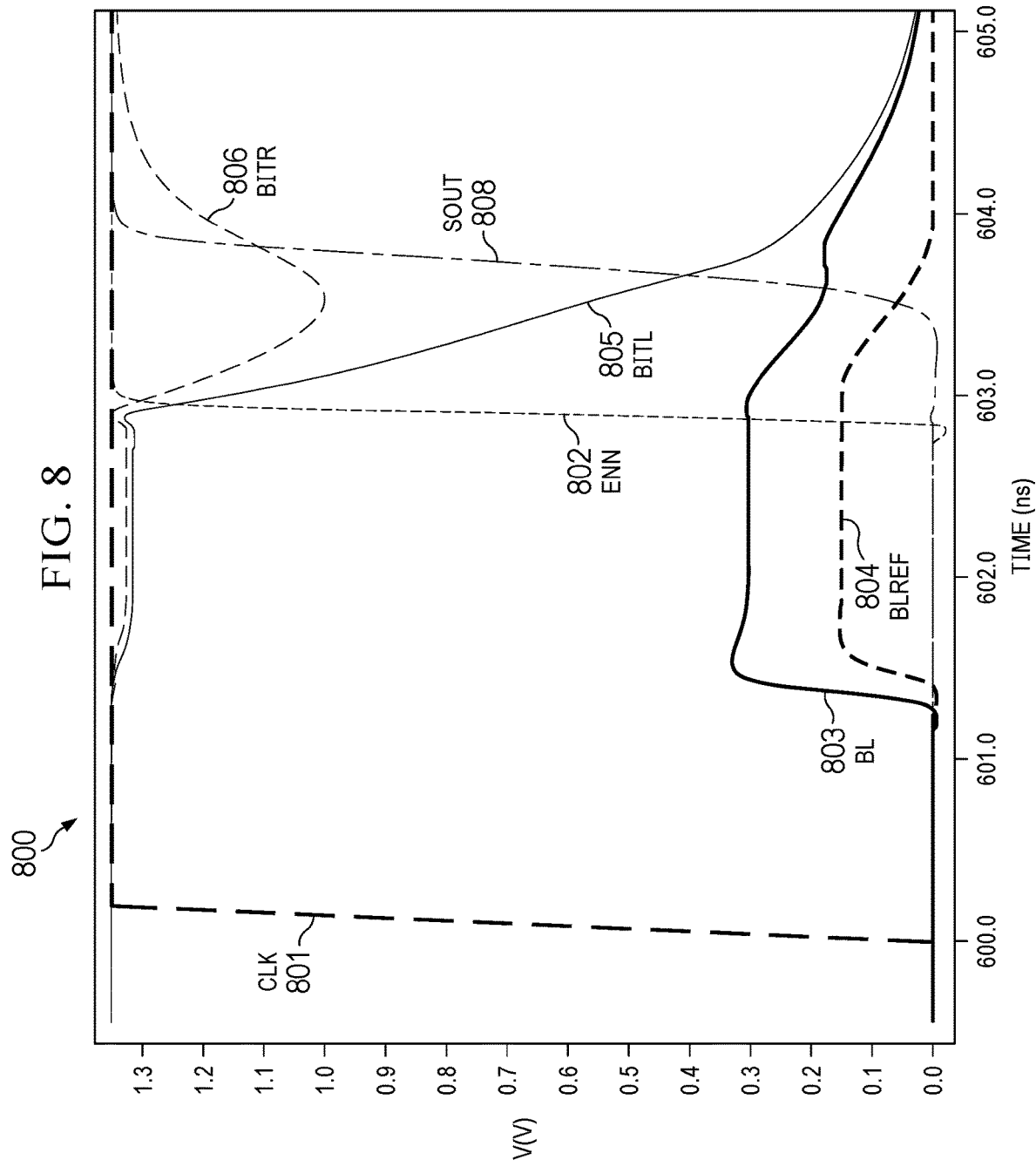
FIG. 8 is a graph of voltage signals in the electronic device during a memory read operation to read a programmed memory cell.
Figure 9:
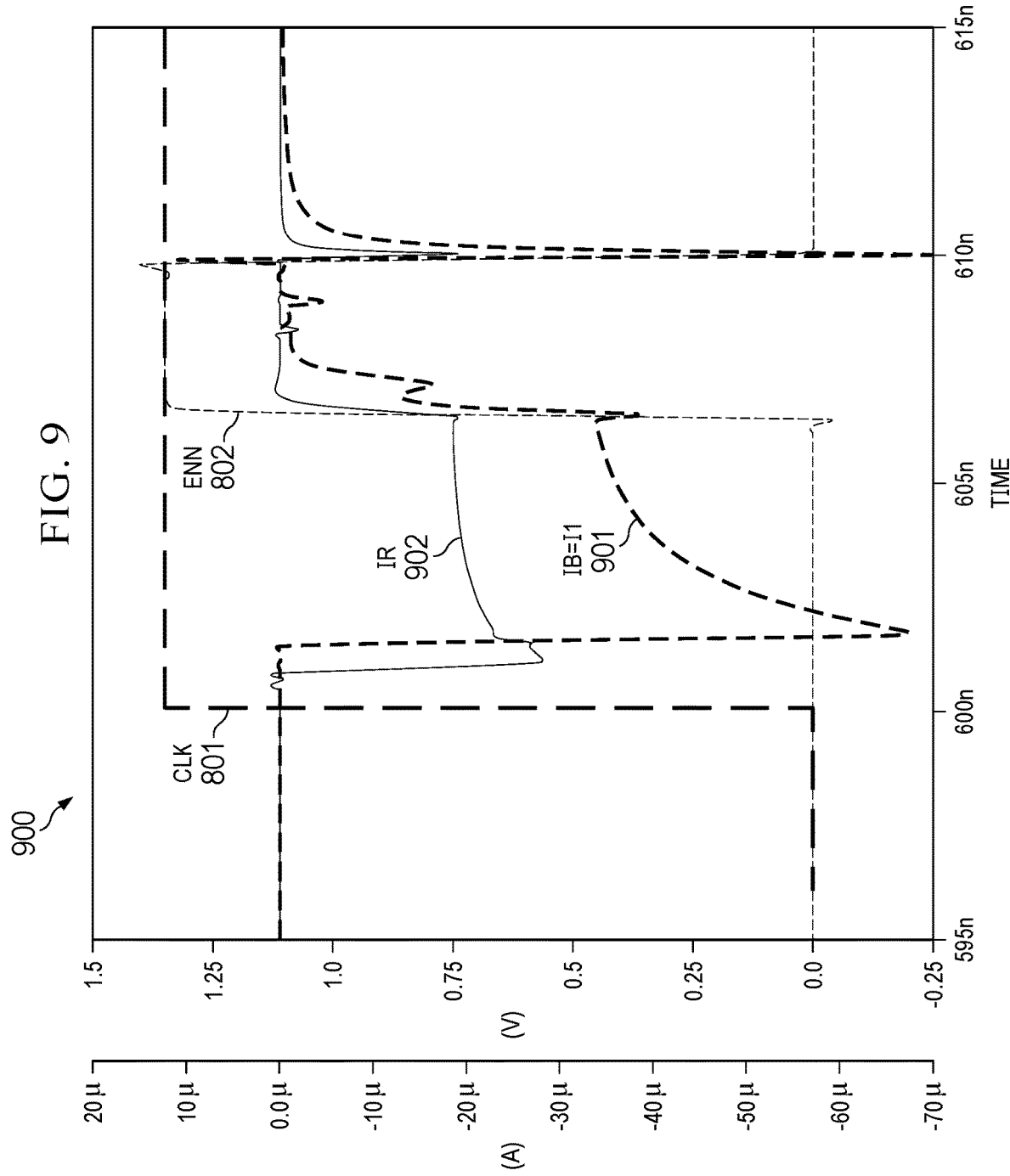
FIG. 9 is a graph of voltage and current signals in the electronic device during a memory read operation to read the programmed memory cell.

Referring now to FIGS. 6-9, FIGS. 6 and 7 show graphs of signals in the electronic device 100 during a memory read operation to read an unprogrammed memory cell, and FIGS. 8 and 9 show graphs of signals in the electronic device 100 during a memory read operation to read a programmed memory cell.

For the case of an unprogrammed selected memory cell 104, a graph 600 in FIG. 6 includes a clock curve 601 (e.g., labeled "CLK") with a rising edge at the beginning of an example read operation, as well as a curve 602 showing the enable voltage signal ENN from the address decoder and read logic circuit 101. The graph 600 also includes a curve 603 showing a selected bit line voltage signal BL, a curve 604 showing the reference bit line voltage signal BLREF, a curve 605 showing the left-side bit voltage signal BITL at the input of the output buffer inverter 138 in FIG. 1A-1, a curve 606 showing the right-side bit voltage signal BITR at the input of the output buffer inverter 137, and a curve 607 that shows the output voltage signal SOUTZ at the second amplifier output 128 (FIG. 1A).

A graph 700 in FIG. 7 includes the clock curve 601 and the curve 602 showing the enable voltage signal ENN, as well as a curve 701 that shows the selected bit line current IB that goes to approximately −65 µA in response to the discharge circuit 111 discharging the selected bit line 106 and transitions to the second current I2 prior to the sense amplifier being enabled by the rising edge of the ENN curve 602. The graph 700 also has a reference bit line current curve 702 that shows the current IR that is greater (e.g., more negative) than the second current I2 when the amplifier is enabled by the rising edge of the ENN curve 602. In response to the rising edge of the enable voltage signal ENN (curve 602), the differential sense amplifier 120 detects the lower current I2 of the selected bit line (curve 701 in FIG. 7) compared with the higher reference bit line current IR (curve 702 in FIG. 7), and the output voltage signal SOUTZ rises as shown by the curve 607 in FIG. 6. As a result, the output signal SOUT at the first amplifier output 126 in FIG. 1 falls (not shown in FIGS. 6 and 7). In one implementation, the address decoder and read logic circuit 101 of FIG. 1 asserts the enable voltage signal ENN (e.g., curve 602) a predetermined time after the rising edge of the clock curve 601 to allow sufficient current differential establishment with some design margin timing. In this case, the bit line voltage BL saturates at approximately the supply voltage VDD minus a threshold voltage VT since there is no path to the reference voltage node VSS, and the weak reference pulldown current IR is sufficient to trip the differential sense amplifier 120.

The differential sensing detects the alternate condition in a read operation of a programmed cell 104 as shown in FIGS. 8 and 9. For this case, a graph 800 in FIG. 8 includes a clock curve 801 (e.g., labeled "CLK") with a rising edge at the beginning of an example read operation, as well as a curve 802 showing the enable voltage signal ENN from the address decoder and read logic circuit 101. The graph 800 also includes a curve 803 showing a selected bit line voltage signal BL, a curve 804 showing the reference bit line voltage signal BLREF, a curve 805 showing the left-side bit voltage signal BITL at the input of the output buffer inverter 138 in FIG. 1A-1, a curve 806 showing the right-side bit voltage signal BITR at the input of the output buffer inverter 137, and a curve 808 that shows the output voltage signal SOUT at the first amplifier output 126. A graph 900 in FIG. 9 includes the clock curve 801 and the curve 802 showing the enable voltage signal ENN, along with a curve 901 that shows the selected bit line current IB that transitions from zero to approximately −65 µA in response to the discharge circuit 111 discharging the selected bit line 106 and then falls to the first current I1 prior to the sense amplifier being enabled by the rising edge of the ENN curve 802. The graph 900 also includes a reference bit line current curve 902 that shows the current IR that is less than the first current I1 when the amplifier is enabled by the rising edge of the ENN curve 802. In response to the rising edge of the enable voltage signal ENN (curve 802), the differential sense amplifier 120 detects the higher (e.g., more negative) current I1 of the selected bit line (curve 901 in FIG. 9) compared with the lower reference bit line current IR (curve 902 in FIG. 9) and the output voltage signal SOUT rises as shown by the curve 808 in FIG. 8. As a result, the output signal SOUTZ at the second amplifier output 128 falls (not shown in FIGS. 8 and 9).

Figure 10:
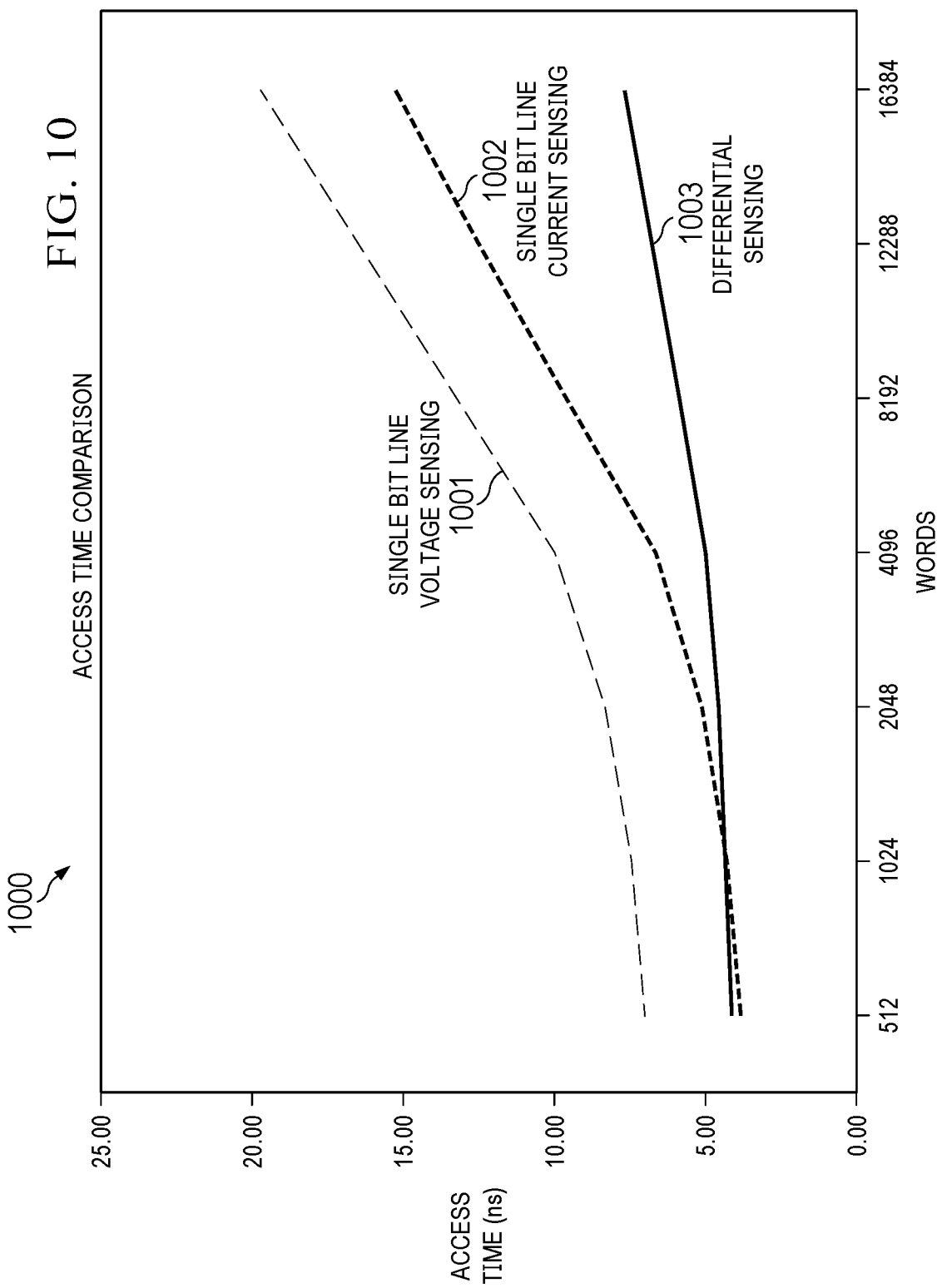
FIG. 10 is a graph of access time performance.
Figure 11:
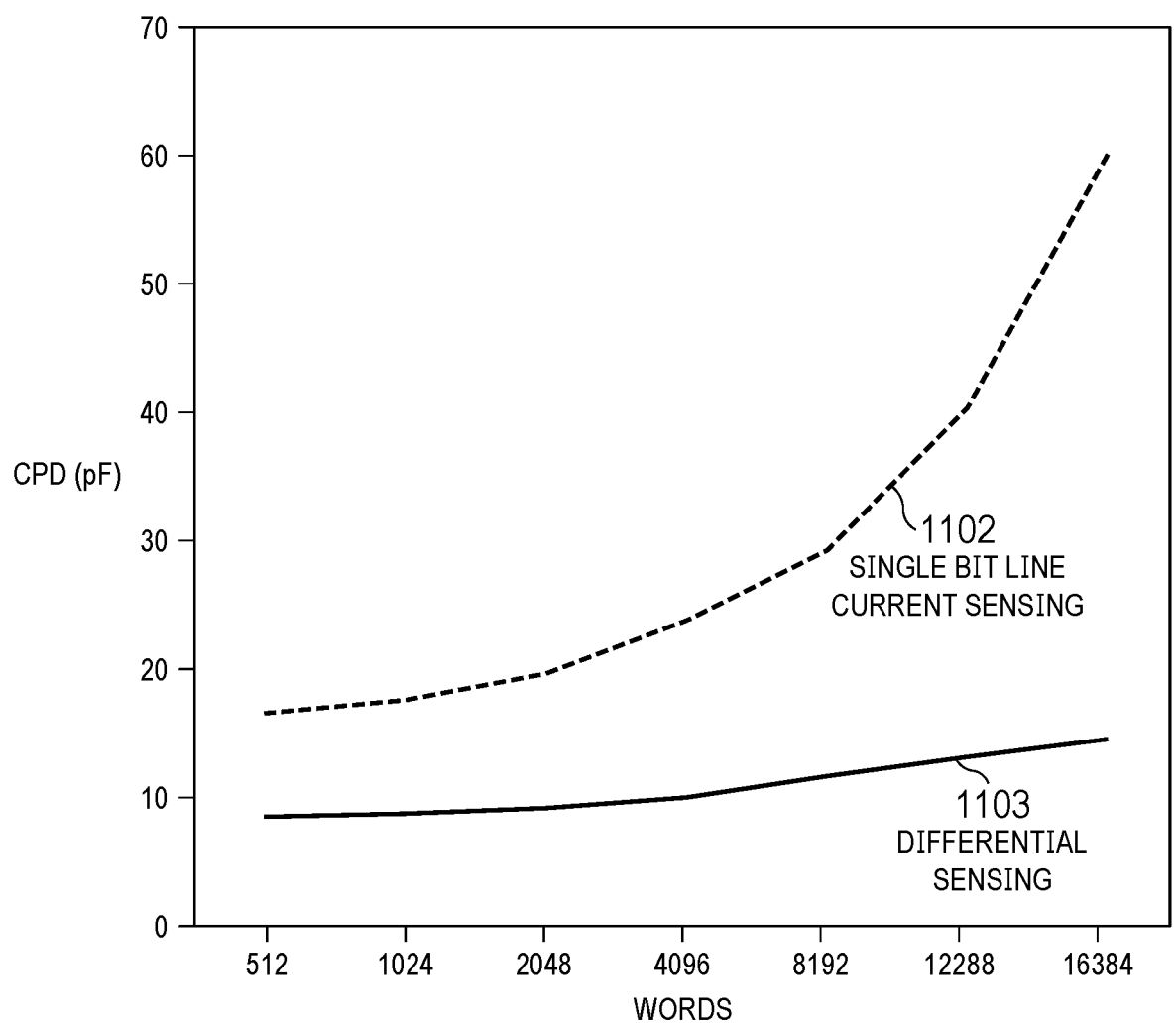
FIG. 11 is a graph of capacitance and read power performance.
Figure 12:
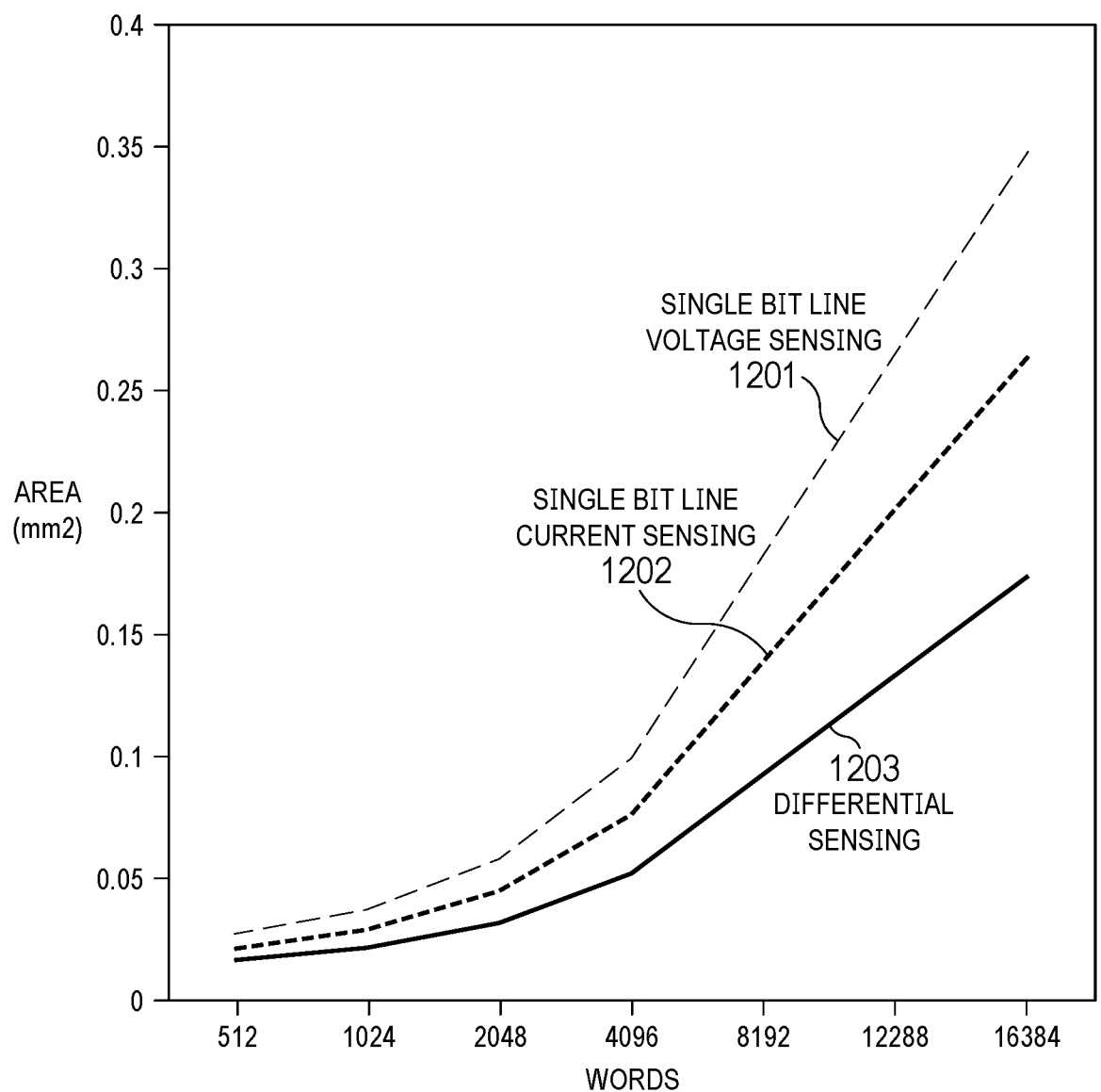
FIG. 12 is a graph of ROM circuit area.

Referring also to FIGS. 10-12, FIG. 10 shows a graph 1000 of access time performance, including a curve 1001 showing the access time as a function of the number of words read for a single bit line voltage sensing circuit (not shown), a curve 1002 showing the access time performance for a single bit line current sensing circuit (not shown), and a curve 1003 that shows the access time performance for differential sensing in the example electronic device 100 using the differential sense amplifier 120 with the multiplexer logic circuit 110 controlling the reference bit line current IR as described above. As shown in FIG. 10, the described examples provide a significant performance improvement in terms of reduced access time.

FIG. 11 shows a graph 1100 of capacitance and read power performance, including a curve 1102 for a single bit line current sensing circuit (not shown), and a curve 1103 that shows the reduced capacitance, and thus the reduced power consumption of the electronic device 100 having the differential sense amplifier 120 and the multiplexer logic circuit 110 with controlled reference bit line current IR.

FIG. 12 shows a graph 1200 of ROM circuit area showing the significant circuit area benefits of the example electronic device 100 with the differential sense amplifier 120 and the reference current control features of the multiplexer logic circuit 110. The graph 1200 includes a curve 1201 showing the memory circuitry area for the single bit line voltage sensing implementation (not shown), a curve 1202 that shows memory circuit area for the single bit line current sensing approach (not shown), and a curve 1203 that shows the memory circuit area for the example electronic device 100 having the differential sense amplifier 120 with the multiplexer logic circuit 110 controlling the reference bit line current IR. As shown in the graph 1200, the illustrated examples provide significant benefits allowing reduced circuit area, and increased circuit and power density in the electronic device 100. Although the differential architecture of the sense amplifier 120 require some additional circuit area, the memory design does not require separation of the memory array into blocks as was needed in single bit line voltage or current sensing approaches to reduce access times, and the disclosed examples are advantageous with respect to reduced circuit area overall in addition to the access time advantages shown in FIG. 10 and the power performance advantages illustrated in FIG. 11.

Modifications are possible in the described examples, and other implementations are possible, within the scope of the claims.

What is claimed is:

1. A semiconductor device, comprising:
   a read-only memory (ROM) having a plurality of memory cells in an array arranged in rows along respective word lines and columns along respective bit lines, a reference column of the array having reference transistors along a reference bit line, the memory cells including one of a corresponding plurality of cell transistors configured in a first state or in a second state, the cell transistors in the first state configured to conduct a first bit line current along the respective bit line when selected, the cells in the second state configured to conduct a second bit line current along the respective bit line when selected, and the first bit line current greater than the second bit line current;
   a differential sense amplifier configured to generate a differential output voltage signal between first and second differential outputs based on first and second differential input currents at respective first and second amplifier inputs; and
   a multiplexer logic circuit configured to selectively couple a selected one of the bit lines to the first amplifier input, couple a reference current to the second amplifier input via the reference bit line, and control the reference current to be between the first bit line current and the second bit line current.

2. The semiconductor device of claim 1, wherein the multiplexer logic circuit is configured to control the reference current of the reference bit line to be approximately half the first bit line current.

3. The semiconductor device of claim 2, wherein the multiplexer logic circuit includes a select circuit having a row of bit select transistors coupled between the first amplifier input and the respective bit lines, and a plurality of reference select transistors coupled in series between the second amplifier input and the reference bit line, the bit select transistors and the reference select transistors having about a same first gate width.

4. The semiconductor device of claim 3, wherein the cell transistors and the reference transistors have about a same second gate width.

5. The semiconductor device of claim 4, wherein the multiplexer logic circuit includes a discharge circuit having discharge transistors coupled to the respective bit lines, and a reference discharge transistor coupled to the reference bit line, the discharge transistors configured to discharge the bit lines during a read operation, and the reference discharge transistor configured to discharge the reference bit line during the read operation.

6. The semiconductor device of claim 2, wherein the cell transistors and the reference transistors have about a same gate width.

7. The semiconductor device of claim 1, wherein the multiplexer logic circuit includes a select circuit having a row of select transistors coupled between the first amplifier input and the respective bit lines, and a plurality of reference select transistors coupled in series between the second amplifier input and the reference bit line, the select transistors and the reference select transistors having about a same gate width.

8. The semiconductor device of claim 7, wherein the multiplexer logic circuit includes a discharge circuit having discharge transistors coupled to the respective bit lines, and a reference discharge transistor coupled to the reference bit line, the discharge transistors configured to discharge the bit lines during a read operation, and the reference discharge transistor configured to discharge the reference bit line during the read operation.

9. The semiconductor device of claim 7, wherein the gate width is a first gate width, and the cell transistors and the reference transistors have about a same second gate width.

10. The semiconductor device of claim 1, wherein the cell transistors and the reference transistors have about a same gate width.

11. The semiconductor device of claim 1, wherein the multiplexer logic circuit includes a discharge circuit having discharge transistors coupled to the respective bit lines, and a reference discharge transistor coupled to the reference bit line, the discharge transistors configured to discharge the bit lines during a read operation, and the reference discharge transistor configured to discharge the reference bit line during the read operation.

12. A method of forming a semiconductor device, the method comprising:
    forming transistors in or over a semiconductor substrate; and
    forming a metallization structure with transistor interconnections to form a read-only memory (ROM), a differential sense amplifier, and a multiplexer logic circuit, the ROM having a plurality of memory cells in an array arranged in rows along respective word lines and columns along respective bit lines, the memory cells including one of a corresponding plurality of cell transistors, a reference column of the array having reference transistors along a reference bit line, the differential sense amplifier configured to generate a differential output voltage signal between first and second differential outputs based on first and second differential input currents at respective first and second amplifier inputs, and the multiplexer logic circuit configured to selectively couple a selected one of the bit lines to the first amplifier input and couple the reference bit line to the second amplifier input,
    wherein the cell transistors programmed in a first state conduct a first bit line current along the respective bit line when selected, the cell transistors programmed in a second state conduct a second bit line current along the respective bit line when selected, the first bit line current is greater than the second bit line current, and the multiplexer logic circuit is configured to control a reference current of the reference bit line to be between the first bit line current and the second bit line current.

13. The method of claim 12, wherein the multiplexer logic circuit is configured to control the reference current of the reference bit line to be approximately half the first bit line current.

14. The method of claim 13, wherein the multiplexer logic circuit includes a select circuit having a row of bit select transistors coupled between the first amplifier input and the respective bit lines, and a plurality of reference select transistors coupled in series between the second amplifier input and the reference bit line, the bit select transistors and the reference select transistors having about a same first gate width.

15. The method of claim 13, wherein the cell transistors and the reference transistors have about a same gate width.

16. The method of claim 12, wherein the multiplexer logic circuit includes a select circuit having a row of select transistors coupled between the first amplifier input and the respective bit lines, and a plurality of reference select transistors coupled in series between the second amplifier input and the reference bit line, the select transistors and the reference select transistors having about a same gate width.

17. The method of claim 16, wherein the gate width is a first gate width, and the cell transistors and the reference transistors have about a same second gate width.

18. The method of claim 12, wherein the cell transistors and the reference transistors have about a same gate width.

* * * * *